United States Patent

Tadatomo et al.

Patent Number: 5,770,887
Date of Patent: Jun. 23, 1998

[54] GAN SINGLE CRYSTAL

[75] Inventors: Kazuyuki Tadatomo; Shinichi Watabe; Hiroaki Okagawa, all of Itami; Kazumasa Hiramatsu, Yokkaichi, all of Japan

[73] Assignee: Mitsubishi Cable Industries, Ltd., Hyogo, Japan

[21] Appl. No.: 320,263

[22] Filed: Oct. 11, 1994

[30] Foreign Application Priority Data

| Oct. 8, 1993 | [JP] | Japan | 5-253098 |
| Mar. 31, 1994 | [JP] | Japan | 6-062813 |
| Mar. 31, 1994 | [JP] | Japan | 6-062815 |

[51] Int. Cl.⁶ .......................... C30B 35/00; H01L 33/00; H01L 29/14
[52] U.S. Cl. .......................... 257/613; 257/103; 257/76; 257/78; 257/12; 257/614
[58] Field of Search ........................ 257/613, 78, 77, 257/103, 94, 12, 76, 614

[56] References Cited

U.S. PATENT DOCUMENTS

| 3,819,974 | 6/1974 | Stevenson et al. | 257/103 |
| 4,855,249 | 8/1989 | Akasaki et al. | 257/103 |
| 4,911,102 | 3/1990 | Manabe et al. | 156/613 |
| 4,918,497 | 4/1990 | Edmond | 257/103 |
| 5,076,860 | 12/1991 | Ohba et al. | 437/110 |
| 5,182,670 | 1/1993 | Khan et al. | 257/17 |
| 5,239,188 | 8/1993 | Takeuchi et al. | 257/78 |
| 5,290,393 | 3/1994 | Nakamura | 437/127 |
| 5,347,157 | 9/1994 | Hung et al. | 257/12 |
| 5,387,459 | 2/1995 | Hung | 428/209 |
| 5,389,571 | 2/1995 | Takeuchi et al. | 437/133 |
| 5,393,993 | 2/1995 | Edmond et al. | 257/103 |
| 5,404,369 | 4/1995 | Mori et al. | 372/45 |
| 5,432,808 | 7/1995 | Hatano et al. | 257/77 |
| 5,523,589 | 6/1996 | Edmond et al. | 257/103 |
| 5,530,267 | 6/1996 | Brandle, Jr. et al. | 257/76 |
| 5,592,501 | 1/1997 | Edmond et al. | 372/45 |

OTHER PUBLICATIONS

Nakamura "In Situ Monitoring of GaN Growth using Interference Effects" Japanesse Journal of Applied Physics vol. 30, No. 8, pp. 1620–1627, Aug. 1991.

Nakamura et al. "In Situ Monitoring and Hall Measurements of GaN Grown with GaN Buffer Layers" Journal of Applied Physics, vol. 71, No. 7, Jun. 1992.

Detchprohm et al. "Hydride vapor Phase Epitaxial growth of a High Quality GaN Film using a ZnO Buffer Layer" Applied Physic Letters, vol. 6, No. 22, Nov. 1992.

Primary Examiner—Tom Thomas
Assistant Examiner—Alexander Oscar Williams
Attorney, Agent, or Firm—Sughrue, Mion, Zinn, Macpeak & Seas, PLLC

[57] ABSTRACT

A GaN single crystal having a full width at half-maximum of the double-crystal X-ray rocking curve of 5–250 sec and a thickness of not less than 80 $\mu$m, a method for producing the GaN single crystal having superior quality and sufficient thickness permitting its use as a substrate and a semiconductor light emitting element having high luminance and high reliability, comprising, as a substrate, the GaN single crystal having superior quality and/or sufficient thickness permitting its use as a substrate.

8 Claims, 4 Drawing Sheets

GAN SINGLE CRYSTAL

FIELD OF THE INVENTION

The present invention relates to a GaN single crystal which is sufficiently thick and superior in quality, production thereof and to a semiconductor light emitting element comprising said GaN single crystal as a crystal substrate. The GaN single crystal can serve well as a GaN single crystal substrate for a semiconductor light emitting element comprising a light emitting part composed of a poly-compound semiconductor particularly having GaN as one component thereof.

In the description to follow, the crystal substrate is simply referred to as substrate. In addition, compound semiconductors having GaN as one component thereof, such as a binary mixed crystal GaN, poly mixed crystals GaAlN, GaBN, InGaAlN, InGaAlBN etc. are to be referred to as GaN group compound semiconductors.

BACKGROUND OF THE INVENTION

Motivated by a demand for multicolor light emitting displays and improved data density in communication and recording, there is a strong desire for a semiconductor light emitting element capable of emitting light of shorter wavelength ranging from a blue light wavelength to an ultraviolet wavelength.

GaN is drawing much attention as a semiconductor material to be used for said semiconductor light emitting element. The direct transition type band structure of GaN permits highly efficient emission of light. GaN, moreover, emits light of shorter wavelength ranging from a blue light wavelength to an ultraviolet wavelength, due to a great band gap at room temperature of about 3.4 eV, thus rendering itself suitable for the above-mentioned semiconductor devices.

On the other hand, GaN requires a high crystal growth temperature (a temperature where crystal growth can take place), at which temperature the equilibrium vapor pressure of nitrogen is high. The high pressure makes production of a bulky single crystal of good quality from a molten solution of GaN very difficult. Accordingly, a GaN single crystal has been heteroepitaxially formed on a sapphire substrate or SiC substrate superior in heat resistance by MOVPE (Metal Organic Vapor Phase Epitaxy) or MBE (Molecular Beam Epitaxy).

In recent years, however, there has been reported a method (see Applied physics letter Vol.61 (1992) p.2688) wherein ZnO is formed on a sapphire substrate as a buffer layer and GaN single crystal is formed on the ZnO buffer layer. This method has been conducive to the improvement in the quality of GaN single crystal layer, as compared with direct crystal growth on a sapphire substrate.

The aforementioned conventional method using ZnO as a buffer layer, however, fails to produce a single crystal ZnO buffer layer of good quality, since ZnO is formed on a sapphire substrate by sputtering. The poor quality of the ZnO single crystal buffer layer affects the quality of the GaN single crystal layer to be formed thereon, to result in deficient crystal structure and presence of impurities in the GaN single crystal layer obtained, thus failing to produce a GaN single crystal layer of superior quality.

Even the conventionally known GaN single crystal of the highest quality has a full width at half-maximum of the double-crystal X-ray rocking curve of about 100 sec and mobility at room temperature of 600 $cm^2/VS$. Due to the MOVPE done for growing a crystal layer, however, the layer is obtained only at a thickness of about 5 $\mu$m at most and it is difficult to separate the GaN single crystal from the substrate on which it has been formed and use same, for example, as a substrate for a semiconductor light emitting element. For this reason, GaN single crystals have been used along with the substrates on which they are formed.

In the following description, the full width at half-maximum of the double-crystal X-ray rocking curve is to be referred to as full width at half-maximum, since, as used herein, it always denotes the value of the double-crystal X-ray rocking curve. The full width at half-maximum is to be abbreviated as FWHM. Accordingly, the FWHM means full width at half-maximum of the double-crystal X-ray rocking curve.

The GaN single crystal formed on a ZnO buffer layer by HVPE (Hydride Vapor Phase Epitaxy) as mentioned above has a sufficient thickness for a substrate, whereas its quality is poor as evidenced by its FWHM which is not less than 300 sec.

In other words, there has never existed a GaN single crystal having both good quality and sufficient thickness.

SUMMARY OF THE INVENTION

Accordingly, an object of the present invention is to provide a GaN single crystal having superior quality and sufficient thickness permitting its use as a substrate.

Another object of the present invention is to provide a method for producing the GaN single crystal having superior quality and sufficient thickness permitting its use as a substrate.

A still another object of the present invention is to provide a semiconductor light emitting element having high luminance and high reliability, comprising, as a substrate, the GaN single crystal having superior quality and sufficient thickness permitting its use as a substrate.

The GaN single crystal of the present invention has high quality to the extent that FWHM thereof is 5–250 sec and is sufficiently thick (not less than 80 $\mu$m) to permit its use as a substrate.

The above-mentioned GaN single crystal having superior quality and sufficient thickness can be produced by the method of the present invention. To be specific, a material showing good lattice match with GaN single crystal is grown on a first substrate having GaN single crystal at least on its surface; using the formed layer as a buffer layer, GaN crystal is grown thereon to give a GaN single crystal layer of hither quality; using the formed GaN single crystal layer as a new substrate, a buffer layer is grown thereon; and a GaN single crystal layer is formed on the buffer layer. For short, the method of the present invention is alternative epitaxial growth of buffer layer and GaN single crystal layer wherein the repetitive growth affords high quality of GaN single crystal.

The GaN single crystal thus obtained has good quality and can have a thickness of not less than 80 $\mu$m on demand to be suitably used as a substrate for a semiconductor light emitting element.

DETAILED DESCRIPTION OF THE INVENTION

The GaN single crystal of the present invention has a full width at half-maximum of the double-crystal X-ray rocking curve of 5–250 sec and has a thickness of not less than 80 $\mu$m. Accordingly, the single crystal of the present invention is superior in quality and thick enough to be used as a substrate, which properties being never concurrently achieved by conventional GaN single crystals.

Such GaN single crystal can be produced, for example, by the method of the present invention which is to be described in the following.

Figure 1:
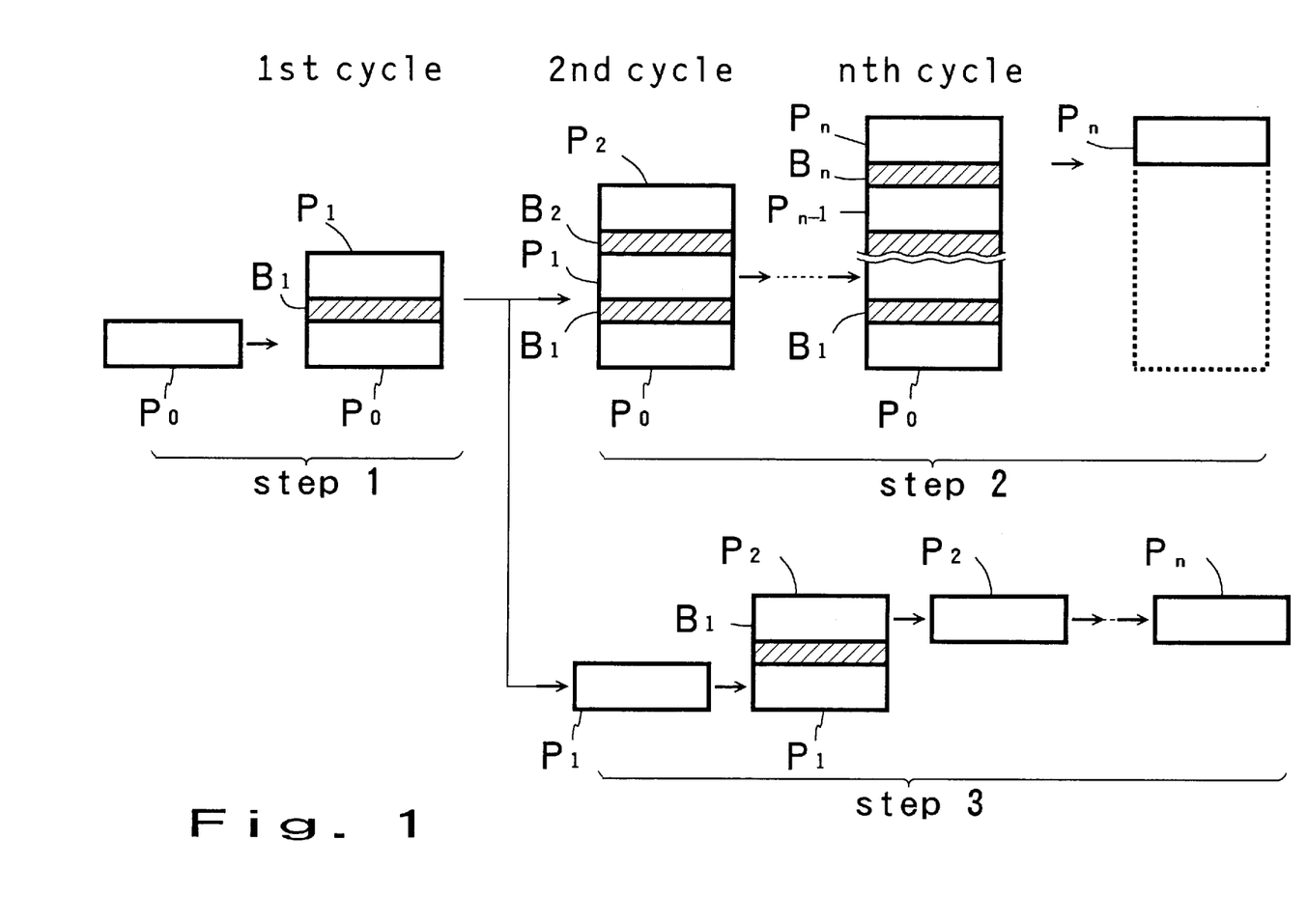
FIG. 1 schematically shows one embodiment of the steps for producing GaN single crystal by the method of the present invention.

The method for producing the GaN single crystal of the present invention is most simply shown by step 1 in FIG. 1.

That is, a substrate having GaN single crystal at least on its surface is used as a first substrate $P_0$. On the first substrate $P_0$ is precipitated a material showing good lattice match with the GaN single crystal, to give a buffer layer $B_1$. Then, a GaN single crystal $P_1$ is formed on the buffer layer $B_1$.

This GaN single crystal $P_1$ is the production target. Said GaN single crystal has improved crystal quality as compared with the GaN single crystal of the first substrate $P_0$.

Also, the method for producing the GaN single crystal of the present invention is shown by step 2 in FIG. 1.

In this step, the laminate $(P_0+B_1+P_1)$ obtained in step 1 is used as a new substrate, on which a material having good lattice match with GaN single crystal is grown to give a buffer layer $B_2$. A GaN single crystal $P_2$ is grown on the buffer layer $B_2$. The step including forming a buffer layer on the GaN single crystal obtained in the previous step as a substrate and growing a GaN single crystal on the buffer layer is one cycle of repetitive unit in the present invention.

Then, counting step 1 as a first cycle of the crystal growth, the repetitive step is performed n times to give a laminate having a GaN single crystal $P_n$ at the uppermost layer. The buffer layers accumulated so far in the obtained laminate are removed to give plural GaN single crystals $P_1$ to $P_n$.

In this method, the more the number of repeats, the better the quality of the GaN crystal. However, the quality of the crystal reaches an equilibrium state at a certain point. After the crystal quality has reached the equilibrium state, the subsequent repetition of the cycle is useful for producing a large number of GaN single crystal substrates, rather than for improving the crystal quality.

Further, the method for producing the GaN single crystal of the present invention is shown by step 3 in FIG. 1.

In this step, the buffer layer $B_1$ of step 1 is removed to separate the GaN single crystal $P_1$. Using $P_1$ as a new substrate, a material having good lattice match with GaN single crystal is grown to give a buffer layer $B_2$. A GaN single crystal $P_2$ is formed on the buffer layer $B_2$ and the buffer layer $B_2$ is removed to separate the GaN single crystal $P_2$. As described, one cycle of the repetitive unit includes forming of a buffer layer on the GaN single crystal obtained in the previous step as a substrate, growing a GaN single crystal thereon and removing the buffer layer to separate the GaN single crystal thus obtained. Thus, n GaN single crystals $P_1$ to $P_n$ can be obtained by repeating the above-mentioned repetitive unit n times, counting step 1 as a first cycle of the crystal growth.

Alternatively, the present method includes removing the buffer layer on which a new GaN single crystal has been grown, at the end of every cycle and separating the newly-formed GaN single crystal into an independent layer. The improvement in quality in this step is as described in step 2 above. In addition, the two GaN single crystals obtained by removing the buffer layer at every cycle of repetitive unit may be used as materials for other products or as the substrates for the next GaN crystal growth.

A combination of the steps 2 and 3 as appropriate may be also used. That is, the buffer layers are removed all at once upon repeats of the repetitive unit for the desired number of times k. The optional number k may be selected as desired.

The total number of the cycles of repetitive unit of the aforementioned crystal growth is subject to no particular limitation and it may be selected according to the desired quality of GaN single crystal or the number of GaN single crystals needed. For use as a substrate for conventional semiconductor devices, GaN single crystal requires 2 to 5 times of repetition of the aforementioned cycle.

For forming a buffer layer on a substrate, known methods such as sputtering and CVD, or various epitaxial methods are used. Sputtering is preferable in that layers are easily formed. A method permitting epitaxial growth is particularly preferable for improving the quality of the GaN single crystal obtained.

A method for growing a GaN single crystal on a buffer layer is preferably that permitting epitaxial growth in view of the improvement in the quality of crystal.

Examples of the method permitting epitaxial growth of the materials to form GaN single crystal and buffer layer include VPE (Vapor Phase Epitaxy), HVPE, MOVPE, MBE, GS-MBE (Gas Source MBE) and CBE (Chemical Beam Epitaxy).

When a buffer layer and a GaN single crystal thereon are formed by the same epitaxial growth method, consecutive growth in situ from the buffer layer on to the GaN single crystal can be performed only by changing the material to be fed.

While the buffer layer may be removed by any method insofar as it can separate the GaN single crystal obtained, chemical removal with an acid etc. is effective.

The first substrate $P_0$ has GaN single crystal at least on the surface thereof. The substrate may be that substantially made of GaN alone in its entirety or that having GaN single crystal only on the surface thereof.

When the latter is used, the material to become the substrate for growing the GaN single crystal on the surface preferably has superior resistance to the heat (1000°–1100° C.) necessary for the growth of GaN single crystal and is exemplified by sapphire crystal substrate, Si substrate, rock crystal, ZnO substrate and SiC substrate.

Of the substrates having GaN single crystal only on the surface as described above, the following is more preferable as the first substrate $P_0$.

Figure 2:
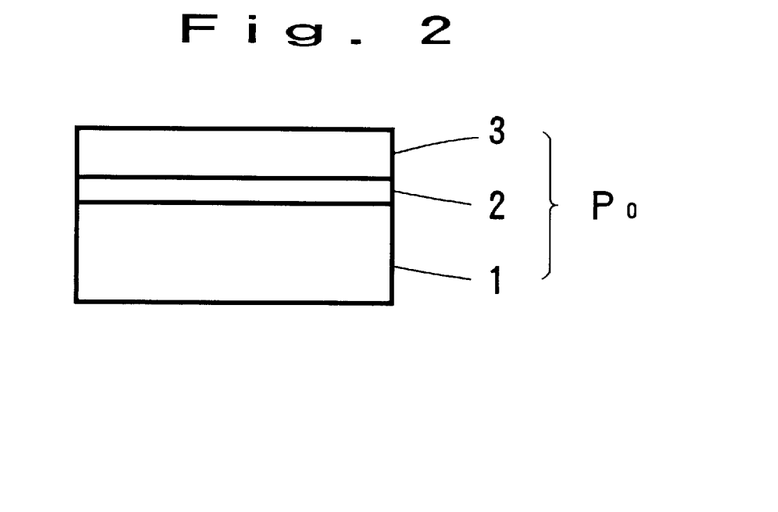
FIG. 2 schematically shows a three-layer structure of a substrate.

The desirable substrate has a three-layer structure comprising sapphire crystal as a substrate 1, a buffer layer 2 of $Ga_jAl_{1-j}N$ (wherein $0 \leq j \leq 1$) formed thereon, and a surface layer 3 of GaN single crystal to be formed on the buffer layer. The three-layer substrate is preferable as a first substrate $P_0$, with the surface thereof being GaN single crystal of superior quality. The technique described in Journal of Applied Physics Vol.71 (1992) p.5543 and Japanese Journal of Applied Physics Vol.30 (1992) p.1620 may be applied to the production of the three-layer substrate.

The composition ratio j in $Ga_jAl_{1-j}N$ of the buffer layer 2 is not limited to a certain number with respect to GaN single crystal and may vary depending on production conditions such as growth temperature, growth pressure, feeding speed of the starting material etc.

While the thickness of the buffer layer 2 is not limited, it is preferably about 50 Å to 1000 Å, at which thickness the crystallinity of the GaN single crystal to grow on the buffer layer becomes most desirable.

While the thickness of the surface layer 3 of GaN single crystal is not limited, it is preferably not less than 0.3 μm, with which thickness the first substrate $P_0$ becomes most preferable.

The $Ga_jAl_{1-j}N$ buffer layer 2 to be formed on the sapphire crystal substrate 1 and the surface GaN single crystal layer 3 to be formed on the buffer layer 2 are preferably formed by epitaxial growth as described in the above.

The material for the buffer layer to be used for producing the GaN single crystal of the present invention is preferably a material having a lattice constant that matches well with that of GaN single crystal. To be specific, a preferable material has a crystal structure of the wurtzite type and a lattice constant at the a-axis of crystal lattice that matches preferably within ±10%, more preferably within ±5% with the lattice constant of GaN single crystal.

Examples of such material are compounds obtained by the use of one or more members from the oxides of the group II elements. Examples of the oxides of the group II elements include BeO, MgO, CaO, ZnO, SrO, CdO, BaO and HgO.

Of the oxides of the group II elements, the more preferable materials for the buffer layer are HgO, BeO and ZnO having the wurtzite type crystal structure as does GaN single crystal.

In particular, ZnO has a lattice constant at the a-axis of 3.2496 Å, which is +1.9% relative to 3.189 Å of the lattice constant at the a-axis of GaN and is very close, and promises good crystal growth of GaN.

In addition, ZnO permits good removal by etching with an acid and is suitable as a material for a buffer layer.

In the present invention, moreover, a compound of the following formula (I), made of BeO, ZnO and HgO is a suitable material for a buffer layer to form GaN single crystal thereon.

$(BeO)_x(ZnO)_y(HgO)_{1-x-y}$ (I)

wherein $0 \leq x \leq 1$, $0 \leq y \leq 1$ and $0 \leq x+y \leq 1$.

Of the compounds of the formula (I), $(BeO)_x(ZnO)_{1-x}$ is particularly suitable for a buffer layer to grow GaN single crystal thereon.

The composition ratios x and y in the above formula are selected in such a manner that the lattice constant of the material designated by the above formula (I) is similar to or the same as the lattice constant of GaN single crystal under various production conditions.

In the present invention, moreover, oxides of the group II elements other than the aforementioned BeO, ZnO and HgO, such as MgO, CaO, SrO and CdO are useful as the material for the buffer layer.

While the crystal structure of these compounds is not of wurtzite type but of zinc blend type, when added to a compound of the formula (I), which is of wurtzite type, in a small amount, the overall crystal structure can be maintained wurtzite type and the obtained compound can be used as a preferable material for the buffer layer. Accordingly, one or more members from MgO, CaO, SrO, CdO and BaO is(are) added to a compound of the formula (I) as the central skeleton in an amount where the wurtzite type crystal structure is maintained, or added thereto to substitute the compound to give a material compound for the buffer layer.

Examples of such material compound include $(MgO)_k(BeO)_m(ZnO)_n(HgO)_{1-k-m-n}$, $(Mgo)_k(BeO)_m(ZnO)_{1-k-n}$ and $(Mgo)_k(ZnO)_{1-k}$. In particular, $(MgO)_k(ZnO)_{1-k}$ is a desirable material for the buffer layer for forming GaN single crystal.

The composition ratios k, m and n in the above formulas are selected in such a manner that the lattice constant of the compound is similar to or the same as the lattice constant of GaN single crystal under various production conditions, as in the case of the compound of the formula (I).

While the thickness of the buffer layer is not limited, it is generally 0.01 μm–2 μm, preferably 0.02 μm–2 μm, and most preferably 0.02 μm–1.5 μm. With this range of thickness, the crystallinity of the desired single crystal to be formed on the buffer layer becomes fine.

As described above, the method for producing the GaN single crystal of the present invention improves the quality of the GaN single crystal every time the cycle of crystal growth is repeated.

Many dislocations and deficiencies present in the GaN single crystal substrate can be reduced in the interface between the substrate and the buffer layer, within the buffer layer, in the interface between the buffer layer and GaN single crystal and within the GaN single crystal. A multitude of repeats of the cycle is considered to gradually bring the quality of the GaN single crystal to the level set depending on the growth conditions etc.

The quality of the GaN single crystal can be still more improved by selecting the first substrate and the material of the buffer layer as stated supra.

The method of the present invention affords a single crystal having superior quality and a crystal structure exhibiting an FWHM of 5–250 sec, reduces dislocations and deficiencies conventionally found during the growth, and provides a crystal having superior quality and sufficient thickness, in the absence of dislocations even when the crystal growth is done for an extended period of time.

The quality of the GaN single crystal of the present invention is expressed numerically using the value of full width at half maximum obtained by X-ray diffraction. The X-ray diffraction is based on the diffraction of the X-ray irradiated on crystal. In the present invention, measurement was done with the use of double-crystal, so as to improve measurement precision.

The X-ray diffraction using double-crystal permits evaluation of lattice constant of a sample crystal with precision and evaluation of the completeness of the crystal based on half-value width.

For evaluation of the quality of the GaN single crystal of the present invention, the X-ray entering from an X-ray source was monochromized to a high degree by the first crystal and irradiated on the GaN single crystal (second crystal) of a sample, whereafter full width at half-maximum about the peak of the X-ray diffracted from the sample was measured.

As the X-ray source, $Cuk\alpha_1$ was used and X-ray was generated at 30 kV and 10 mA. For monochromization, Ge (400) was used as the first crystal. The measurement was done with respect to the diffraction peak of GaN (0002) at a step interval of measurement of 0.002°.

A GaN single crystal was produced by the method of the present invention and the quality of the single crystal was evaluated, the results of which follow hereunder.

EXPERIMENTAL EXAMPLE 1

As the first substrate $P_0$ to be used in the production of the GaN single crystal of the present invention, a substrate wherein GaN single crystal had been epitaxially grown on a sapphire crystal substrate by MOVPE was used. The buffer layer had a thickness of 0.2 μm and was made of ZnO. The cycle of crystal growth was repeated 5 times. The thickness of the GaN single crystals $P_1$ to $P_5$ formed at every crystal growth cycle was 300 μm. For repeating the cycle of crystal growth, a buffer layer and a GaN single crystal were sequentially grown on the first substrate $P_0$ to give a laminate and all buffer layers were removed at once to separate the GaN single crystals $P_1$ to $P_5$, as shown in step 2 in FIG. 1.

The GaN single crystal $P_5$ obtained last had an FWHM of 29 sec. The thickness of the GaN single crystal was 305 μm.

EXPERIMENTAL EXAMPLE 2

GaN single crystals were prepared in the same manner as in Experimental Example 1 except that the buffer layer formed previously was removed upon each epitaxial growth of a GaN single crystal and the obtained GaN single crystal was used as a new substrate for the next cycle, as shown in step 3 in FIG. 1, instead of repeating the cycle of crystal growth as in step 2.

The GaN single crystal $P_5$ obtained last had an FWHM of 28 sec. The thickness of the GaN single crystal was 289 μm.

EXPERIMENTAL EXAMPLE 3

GaN single crystals were prepared in the same manner as in Experimental Example 2 except that a substrate having a three-layer structure composed of a sapphire substrate, an AlN (i.e. composition ratio x in $Ga_xAl_{1-x}N$ being 0) buffer layer and a GaN single crystal was used as the first substrate.

Referring to FIG. 2, production of the three-layer substrate is explained briefly in the following. As a buffer layer 2, AlN (i.e. composition ratio x in $Ga_xAl_{1-x}N$ being 0) was epitaxially grown to the thickness of 500 Å on a sapphire crystal substrate 1 (thickness 300 μm, 5 cm×5 cm) by MOVPE; the material gas, alone, was changed and a GaN single crystal was epitaxially grown to the thickness of 2 μm by the same MOVPE to give a surface layer 3; whereby a three-layer substrate of the sapphire crystal substrate 1, the AlN buffer layer 2 and the GaN single crystal surface layer 3, total thickness being about 302 μm, was prepared.

The GaN single crystal $P_5$ obtained last had an FWHM of 25 sec. The thickness of the GaN single crystal was 295 μm.

EXPERIMENTAL EXAMPLE 4

GaN single crystals were prepared in the same manner as in Experimental Example 2 except that a three-layer substrate as used in Experimental Example 3 was used as the first substrate $P_0$ and $(BeO)_{0.13}(ZnO)_{0.87}$ was used as the material for the buffer layer in each cycle of crystal growth of GaN single crystal.

The GaN single crystal $P_5$ obtained last had an FWHM of 28 sec. The thickness of the GaN single crystal was 301 μm.

EXPERIMENTAL EXAMPLE 5

With the aim of examining the quality of a conventional GaN single crystal, a 0.6 μm-thick buffer layer of ZnO was formed on a sapphire crystal substrate (thickness 300 μm, 5 cm×5 cm) by sputtering and a GaN single crystal was epitaxially grown thereon to the thickness of 250 μm by HVPE.

The GaN single crystal $P_5$ obtained last had an FWHM of 420 sec.

As is evident from the above-mentioned experiment results, the method for producing the GaN single crystal of the present invention enables production of a GaN single crystal of superior quality that has never been produced by conventional methods.

The quality of the GaN single crystal can be still more improved by the use of the aforementioned three-layer substrate as the first substrate and selecting the material of the buffer layer as mentioned above.

It is also an advantageous effect of the present invention that a GaN single crystal sufficiently thick for use as a substrate can be obtained.

The thick GaN single crystal of superior quality which is produced by the method of the present invention can be suitably used for semiconductor light emitting elements such as light emitting diode (LED), laser diode (LD) and superluminescence diode, and electron devices. In the electron devices, the use of the GaN single crystal of the present invention as a substrate enables production of LED, LD etc. having the same electrode structure as in the conventional red LED etc. Those which emit blue lights are particularly important. In addition, the efficiency of the light emission of semiconductor light emitting elements by the use of the GaN single crystal of the present invention is advantageously high.

Examples of the semiconductor light emitting element wherein the GaN single crystal of the present invention is used as a substrate are shown in the following.

Figure 3:
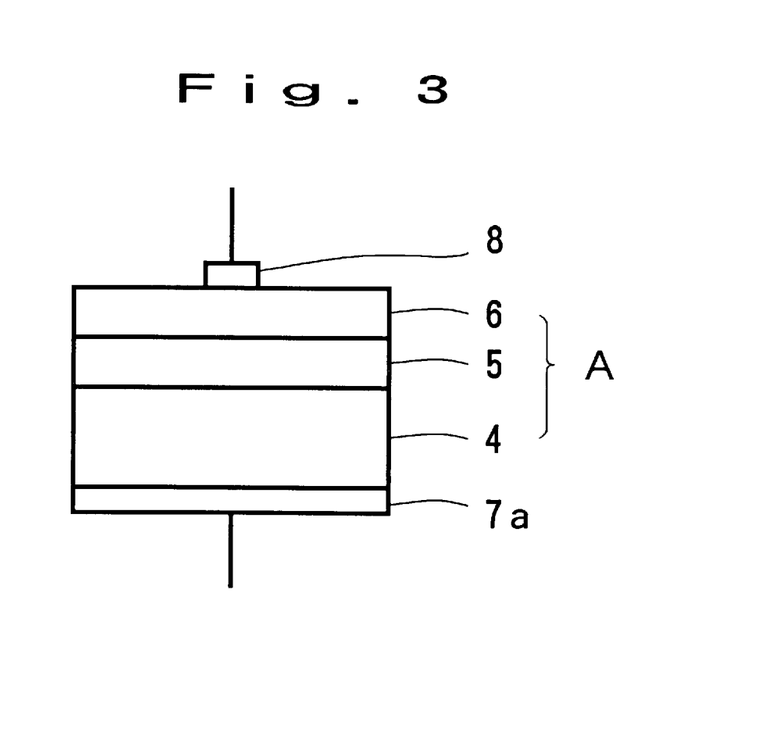
FIG. 3 schematically shows one embodiment of the structure of a light emitting element wherein the GaN single crystal of the present invention is used as a substrate.

FIG. 3 schematically shows the structure of LED of a typical semiconductor light emitting element. As shown in the Figure, the LED comprises a laminate A (4, 5, 6) including the GaN single crystal (n type) produced by the method of the present invention as a substrate 4, and a semiconductor layer 5 (n type) and a semiconductor layer 6 (p type), both being GaN group compound semiconductors, formed thereon, and electrodes 8 and 7 set on the outermost layers 6 and 4 of the laminate A.

By using such GaN single crystal of superior quality as a substrate, a light emitting element can be formed between a pair of electrodes facing each other, which is capable of highly efficient light emission with greater reliability.

Figure 6:
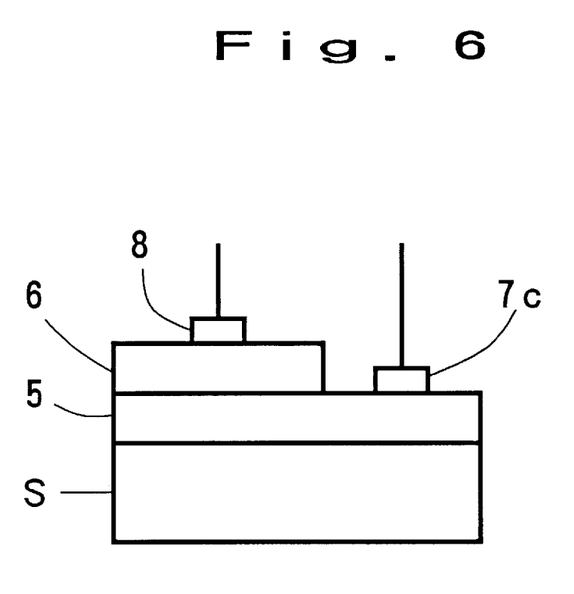
FIG. 6 schematically shows one embodiment of the structure of a conventional light emitting element wherein sapphire crystal is used as a substrate.

A light emitting element by the use of a conventional GaN type single crystal is formed on a sapphire substrate S, as shown in FIG. 6. However, electrodes cannot be formed on the substrate, since the sapphire substrate is an insulating body. For this reason, the positive and negative electrodes 7c and 8 are formed on the upper side of the layer constituting the light emitting part in such a manner that the both electrodes face the sapphire substrate S. Such structure poses problems in that the LED cannot be designed or handled during production and mounting as are conventional LEDs, and that the light emitting area is small. In addition, a conventional GaN single crystal formed on a sapphire substrate is insufficient in crystal quality and light emitting efficiency, due to a great mismatching between the lattice constants of the sapphire and the GaN.

The conductive types p and n of the semiconductor layers 4, 5 and 6 in FIG. 3 may be otherwise. The combination of the components of the GaN group compound semiconductor forming the light emitting part may be any insofar as it permits p-n junction and emits light upon application of forward current. For example, GaNs which are homoepitaxially grown on GaN single crystal substrates and GaN group compound semiconductors of the formula $In_{1-r}(Ga_{1-t}Al_t)_rN$ (wherein t and r is 0–1) heteroepitaxially grown on GaN single crystal substrates are preferably used.

In FIG. 3, the light emitting part has a simple two-layer p-n junction. The junction of the light emitting part may be homo-junction where the same materials are joined, or hetero-junction where different materials are joined. Furthermore, the junctional structure of the light emitting part is not limited to two-layer junction but may be multi-layer junction such as double-hetero junction, single quantum well, multiple quantum well etc.

With such junctional structure of the light emitting part, various semiconductor light emitting elements such as LED and LD are obtained.

Figure 5:
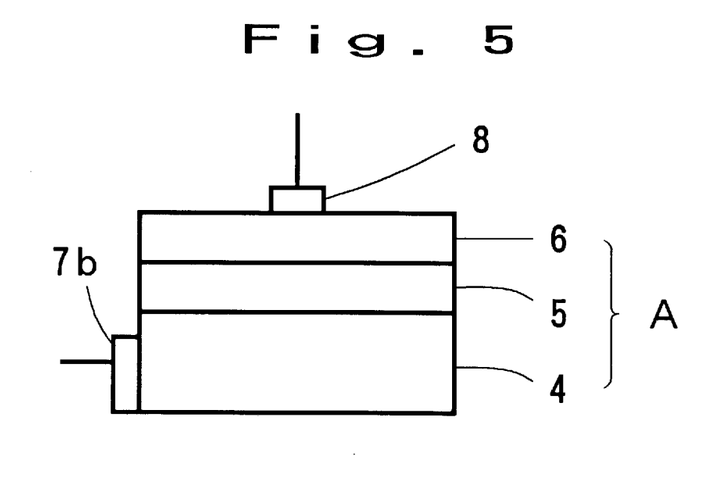
FIG. 5 schematically shows a still another embodiment of the structure of a light emitting element wherein the GaN single crystal of the present invention is used as a substrate.

The electrode to be formed on a substrate may be as 7a shown in FIG. 3, wherein it is formed on the outermost surface of the substrate, or 7b shown in FIG. 5, wherein it is formed on the side of the substrate.

LEDs were manufactured using the GaN single crystal obtained by the method of the present invention as a substrate and the quality thereof was examined.

Figure 4:
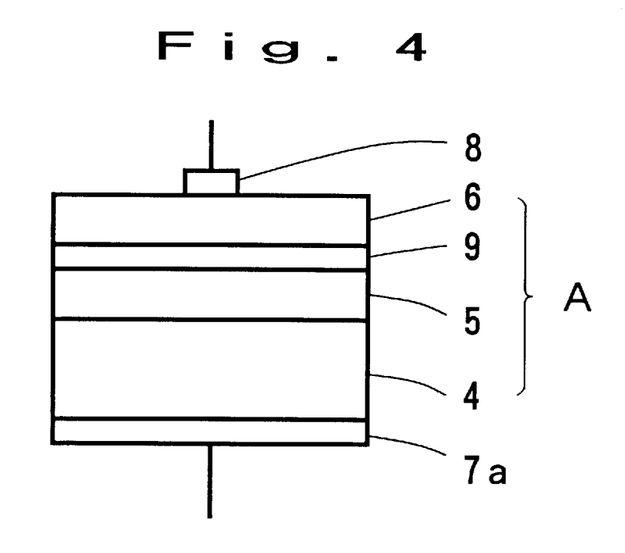
FIG. 4 schematically shows another embodiment of the structure of a light emitting element wherein the GaN single crystal of the present invention is used as a substrate.

The LED had a double hetero junction structure wherein an n-AlGaN cladding layer 5, an undoped InGaN active layer 9, and a p-AlGaN cladding layer 6 are sequentially grown on a GaN single crystal substrate 4 obtained by the method of the present invention (see FIG. 4). The substrate 4 had an FWHM of 30 sec, 100 sec or 250 sec. The thickness was all 280 μm. The composition ratio of InGaN of the active layer was $In_{0.15}Ga_{0.85}N$ or $In_{0.25}Ga_{0.75}N$. A light emitting element was produced with respect to InGaN of respective composition ratio and subjected to experiment.

Alongside therewith, LEDs comprising a conventional GaN single crystal or a sapphire crystal as a substrate were prepared and compared with the LEDs wherein the GaN single crystal of the present invention was used as a substrate in terms of quality. The FWHM of the conventional GaN single crystal was 300 sec.

The LEDs were evaluated as to the initial luminance and service life. The service life was evaluated according to three levels of percent decrease in luminance (A: decrease percentage of less than 2%, B: decrease percentage of from 2 to less than 5%, C: decrease percentage of from 5 to 10%) calculated in relative proportion of the luminance upon 2000 hours of continuous light emission by the application of 20 mÅ current at 85° C. in 85% humidity, to the initial luminance. The results are shown in the following Tables 1 and 2.

TABLE 1

Luminance and life of LED with active layer of $In_{0.15}Ga_{0.85}N$

| Substrate | FWHM (sec) | Initial luminance (candela) | Life |
|---|---|---|---|
| GaN | 30 | 1.8 | A |
| GaN | 100 | 1.4 | A |
| GaN | 250 | 1.2 | B |
| GaN | 300 | 1.1 | B |
| Sapphire | — | 1.0 | C |

TABLE 2

Luminance and life of LED with active layer of $In_{0.25}Ga_{0.75}N$

| Substrate | FWHM (sec) | Initial luminance (candela) | Life |
|---|---|---|---|
| GaN | 30 | 2.9 | A |
| GaN | 100 | 2.5 | A |
| GaN | 250 | 2.2 | B |
| GaN | 300 | 2.2 | B |
| Sapphire | — | 2.0 | C |

As is evident from Tables 1 and 2, the LEDs wherein the GaN single crystal with superior quality of the present invention was used as a substrate were generally superior to the conventional LEDs in terms of initial luminance and service life.

With regard to LD, the following phenomenon was confirmed.

In a conventional LD wherein a sapphire crystal is used as a substrate, the substrate surface does not form a desirable mirror state, since the sapphire crystal hardly permits easy formation of cleavage plane. Accordingly, the surface of the GaN group compound semiconductor layer to be formed on the substrate is affected by the surface condition of the substrate, so that a desirable reflecting surface for LD cannot be formed. In contrast, the GaN single crystal of the present invention has high quality and sufficient thickness, which enables feasible formation of cleavage plane on the GaN single crystal substrate.

An LD wherein a conventional GaN group compound semiconductor was used failed in stimulated emission by current injection, due to inferior quality of the crystal. Then, a stripe laser of Fabry-Peŕrot resonator with the use of the GaN single crystal of the present invention as a substrate was constructed and subjected to experiment. As a result, the stimulated emission occurred at room temperature.

What is claimed is:

1. A GaN single crystal having a full width at half-maximum of the double-crystal X-ray rocking curve of 5–250 sec and a thickness of not less than 80 μm.

2. The GaN single crystal of claim 1, which is produced by the steps of:
   (A) growing on a substrate, a material having a good lattice constant match with a GaN single crystal, wherein said substrate has a first GaN single crystal at least on its surface, and wherein the material comprises an oxide selected from the group consisting of BeO, MgO, ZnO, SrO, CdO, BaO and HgO to form a buffer layer,
   (B) growing a GaN single crystal on the buffer layer of (A) to give a second GaN single crystal, and
   (C) chemically removing the buffer layer to separate the second GaN single crystal.

3. A semiconductor light emitting element comprising:
   (A) a substrate comprising a GaN single crystal having a full width at half-maximum of the double-crystal X-ray rocking curve of 5–250 sec wherein the thickness of the substrate is at least 80 μm,
   (B) plural GaN group compound semiconductor layers comprising a light emitting part wherein said layers are laminated on the substrate of (A) to give a laminate having two outermost layers, and
   (C) an electrode set on each of the two outermost layers of the laminate.

4. The semiconductor light emitting element of claim 3, wherein the GaN single crystal is obtained by growing a material showing good lattice match with GaN single crystal, on a substrate having GaN single crystal at least on its surface, to give a buffer layer, growing GaN crystal thereon to give a GaN single crystal, the above steps being one cycle of crystal growth, and repeating said cycle of crystal growth at least once on the GaN single crystal obtained by the first cycle of crystal growth.

5. The semiconductor light emitting element of claim 3, wherein the light emitting part has a p-n junction selected from the group consisting of a homo-junction, a single-hetero junction, a double-hetero junction, a single quantum well structure and a multiple quantum well structure.

6. The GaN single crystal of claim 1, which is produced by the steps of:

(A) growing on a substrate, a material having a good lattice constant match with a GaN single crystal, wherein said substrate has a first GaN single crystal at least on its surface to form a buffer layer, (B) growing GaN crystal on the buffer layer of (A) to give a second GaN single crystal, the above steps (A) and (B) being a single cycle of crystal growth, (C) repeating said single cycle of crystal growth at least once on the GaN single crystal obtained in step (B), and, (D) removing the buffer layer by chemically separating the GaN single crystals.

7. A semiconductor light emitting element of claim 3 which is produced by the steps of:

(A) growing on a GaN single crystal substrate, a material having a good lattice constant match with a GaN single crystal, wherein said substrate has a first GaN single crystal at least on its surface, to form a buffer layer, (B) growing a GaN single crystal on the buffer layer of (A) to give a second GaN single crystal, and (C) chemically removing the buffer layer to separate the second GaN single crystal.

8. A semiconductor light emitting element of claim 3, which is produced by:

(A) growing on a GaN single crystal substrate, a material having a good lattice constant match with a GaN single crystal, wherein said substrate has a first GaN single crystal at least on its surface to form a buffer layer, (B) growing GaN crystal on the buffer layer of (A) to give a second GaN single crystal, the above steps (A) and (B) being a single cycle of crystal growth, (C) repeating said single cycle of crystal growth at least once on the GaN single crystal obtained in step (B), and, (D) removing the buffer layer by chemically separating the GaN single crystals.

* * * * *

UNITED STATES PATENT AND TRADEMARK OFFICE
CERTIFICATE OF CORRECTION

PATENT NO. : 5,770,887
DATED : June 23, 1998
INVENTOR(S) : Kazuyuki Tadatomo; Shinichi Watabe, Hiroaki Okagawa and Kazumasa Hiramatsu It is certified that error appears in the above-identified patent and that said Letters Patent is hereby corrected as shown below:

On the title page, Item [54] and Column 1, line 1,

In the Title, delete "GAN" and insert --GaN--;

Two references need to be added to page 1 under References Cited, as follows:

U.S. PATENT DOCUMENTS 5,122,845   6/92   Manabe et al.   257/76

FOREIGN PATENT DOCUMENTS

0483688 A2   6/92   Europe

UNITED STATES PATENT AND TRADEMARK OFFICE
CERTIFICATE OF CORRECTION

PATENT NO. : 5,770,887
DATED : June 23, 1998
INVENTOR(S) : Kazuyuki Tadatomo; Shinichi Watabe, Hiroaki Okagawa and Kazumasa Hiramatsu It is certified that error appears in the above-identified patent and that said Letters Patent is hereby corrected as shown below:

Figure 6 should be replaced with the following corrected Figure 6:

Signed and Sealed this

Fourth Day of May, 1999

Attest:

Q. TODD DICKINSON

Attesting Officer

Acting Commissioner of Patents and Trademarks